(12) United States Patent
Morita et al.

(10) Patent No.: US 11,139,261 B2
(45) Date of Patent: Oct. 5, 2021

(54) FILM-LIKE ADHESIVE AND METHOD FOR PRODUCING SEMICONDUCTOR PACKAGE USING FILM-LIKE ADHESIVE

(71) Applicant: FURUKAWA ELECTRIC CO., LTD., Tokyo (JP)

(72) Inventors: Minoru Morita, Tokyo (JP); Noriyuki Kirikae, Tokyo (JP)

(73) Assignee: FURUKAWA ELECTRIC CO., LTD., Tokyo (JP)

( * ) Notice: Subject to any disclaimer, the term of this patent is extended or adjusted under 35 U.S.C. 154(b) by 0 days.

(21) Appl. No.: 16/267,403

(22) Filed: Feb. 5, 2019

(65) Prior Publication Data

US 2019/0181113 A1    Jun. 13, 2019

Related U.S. Application Data

(63) Continuation of application No. PCT/JP2018/027863, filed on Jul. 25, 2018.

(30) Foreign Application Priority Data

Nov. 7, 2017  (JP) .............................. JP2017-214389

(51) Int. Cl.
*H01L 23/00*         (2006.01)
*C09J 163/00*       (2006.01)
(Continued)

(52) U.S. Cl.
CPC .............. *H01L 24/32* (2013.01); *C09J 7/10* (2018.01); *C09J 163/00* (2013.01); *C09J 171/00* (2013.01);
(Continued)

(58) Field of Classification Search
CPC ....... C09J 63/00; C09J 71/00; H01L 21/6836; H01L 23/367; H01L 23/3737; H01L 24/27; H01L 24/32; H01L 24/83
See application file for complete search history.

(56) References Cited

FOREIGN PATENT DOCUMENTS

| CN | 1905168 A | 1/2007 |
|---|---|---|
| CN | 101755025 A | 6/2010 |

(Continued)

OTHER PUBLICATIONS

Machine Translation of JP 2010-174228 (Year: 2010).*

(Continued)

*Primary Examiner* — Mark A Osele
*Assistant Examiner* — Christopher C Caillouet
(74) *Attorney, Agent, or Firm* — Oblon, McClelland, Maier & Neustadt, L.L.P.

(57) ABSTRACT

Provided are a film-like adhesive that can prevent the back surface of a semiconductor chip, the front surface of a substrate, or the front surface of a heat sink from being partially fractured by a filler; and a method for producing a semiconductor package using the film-like adhesive.

The film-like adhesive includes an epoxy resin (A), an epoxy resin curing agent (B), a phenoxy resin (C), and a heat-conductive filler material (D), in which the heat-conductive filler (D) has an average particle size of 0.1 to 10.0 μm, a compression ratio at break in a microcompression test of 5 to 50% of the average particle size of the sample, a fracture strength in a microcompression test of 0.01 to 2.0 GPa, and a thermal conductivity of 30 W/m·K or higher, the content of component (D) is 10 to 70 vol % with respect to the total amount of the components (A) to (D), and the thermal conductivity after thermal curing is 1.0 W/m·K or higher.

2 Claims, 2 Drawing Sheets

(51) Int. Cl.
*H01L 23/367* (2006.01)
*H01L 23/373* (2006.01)
*H01L 21/683* (2006.01)
*C09J 171/00* (2006.01)
*H01L 21/52* (2006.01)
*H01L 23/42* (2006.01)
*C09J 7/10* (2018.01)
*C08K 9/12* (2006.01)

(52) U.S. Cl.
CPC .......... *H01L 21/52* (2013.01); *H01L 21/6836* (2013.01); *H01L 23/367* (2013.01); *H01L 23/3737* (2013.01); *H01L 23/42* (2013.01); *H01L 24/27* (2013.01); *H01L 24/29* (2013.01); *H01L 24/83* (2013.01); *C08K 9/12* (2013.01); *C08K 2201/005* (2013.01); *C09J 2203/326* (2013.01); *C09J 2301/408* (2020.08); *C09J 2461/00* (2013.01); *C09J 2463/00* (2013.01); *H01L 24/73* (2013.01); *H01L 24/85* (2013.01); *H01L 24/86* (2013.01); *H01L 24/92* (2013.01); *H01L 2221/68327* (2013.01); *H01L 2221/68363* (2013.01); *H01L 2221/68377* (2013.01); *H01L 2224/16225* (2013.01); *H01L 2224/27003* (2013.01); *H01L 2224/27436* (2013.01); *H01L 2224/2929* (2013.01); *H01L 2224/29391* (2013.01); *H01L 2224/29439* (2013.01); *H01L 2224/32145* (2013.01); *H01L 2224/48091* (2013.01); *H01L 2224/73253* (2013.01); *H01L 2224/73265* (2013.01); *H01L 2224/83191* (2013.01); *H01L 2224/83203* (2013.01); *H01L 2224/83862* (2013.01); *H01L 2224/92247* (2013.01); *H01L 2225/06589* (2013.01); *H01L 2924/00014* (2013.01); *H01L 2924/066* (2013.01); *H01L 2924/0665* (2013.01); *H01L 2924/07811* (2013.01); *H01L 2924/181* (2013.01)

(56) References Cited

FOREIGN PATENT DOCUMENTS

| | | |
|---|---|---|
| CN | 102676105 A | 9/2012 |
| CN | 103370388 A | 10/2013 |
| EP | 0 779 653 A3 | 6/1997 |
| JP | 2008-222785 | 9/2008 |
| JP | 2009-120826 | 6/2009 |
| JP | 2010-174228 | 8/2010 |
| JP | 2014-96531 | 5/2014 |
| JP | 2014-123453 | 7/2014 |
| TW | 200925231 A | 8/1997 |
| WO | WO 2009/022574 A1 | 2/2009 |
| WO | WO 2017/158994 A1 | 9/2017 |

OTHER PUBLICATIONS

Combined Taiwanese Office Action and Search Report dated Oct. 23, 2019 in Patent Application No. 107136296 (with English translation), citing document AO therein, 10 pages.

International Search Report dated Oct. 9, 2018 in PCT/JP2018/027863 filed on Jul. 25, 2018 (with English Translation of categories of Cited Documents).

Notice of Reasons for Refusal dated May 21, 2020, in Patent Application No. 2017-214389, 10 pages (with unedited computer generated English translation).

Korean Office Action dated May 26, 2020 in Patent Application No. 10-2019-7003876 (with English translation), citing document AO therein, 11 pages.

Written Opinion dated Nov. 9, 2020 in Singaporean Patent Application No. 11201912375S, 6 pages.

Combined Chinese Office Action and Search Report dated Dec. 2, 2020 in Patent Application No. 201880003308.8 (with English machine translation and English translation of Category of Cited Documents), citing documents AO-AR therein, 22 pages.

Search Report dated Apr. 12, 2021 in corresponding Chinese Patent Application No. 201880003308.8 (with English Translation of Category of Cited Documents) citing document AO therein, 3 pages.

* cited by examiner

FILM-LIKE ADHESIVE AND METHOD FOR PRODUCING SEMICONDUCTOR PACKAGE USING FILM-LIKE ADHESIVE

TECHNICAL FIELD

The present invention relates to a film-like adhesive and a method for producing a semiconductor package using the film-like adhesive.

BACKGROUND ART

In recent years, stacked Multi-Chip Packages (MCP) formed by stacking semiconductor chips in multiple stages have been popularized, and those stacked MCP's are mounted as memory packages for mobile telephones and mobile audio equipment. Furthermore, along with multi-functioning of mobile telephones and the like, high densification and high integration of packages are also being pushed ahead. In association with this, multilayer stacking of chips is in progress.

For the adhesion between a wiring board and a semiconductor chip and between semiconductor chips in the production process for such a memory package, paste-like or film-like adhesives (die attach films) are used. However, due to resin flow or resin creeping-up, die attach films that are not likely to cause contamination in semiconductor chips or other members such as wire pads are usually put to use.

Furthermore, in recent years, micronization of wiring rules for semiconductor wafers is underway, and thus, the temperature of semiconductor elements or substrates is prone to increase. Therefore, in order to make it easier to release heat to the outside of the package, die attach films containing fillers having high thermal conductivity, such as conductive powders of gold, platinum, silver, copper, nickel, palladium, iron, aluminum, and stainless steel; and non-conductive powders of silicon oxide, aluminum nitride, boron nitride, aluminum borate, aluminum oxide, magnesium oxide, and diamond, have been suggested (for example, Patent Document 1).

Such a highly heat-conductive die attach film can also be used as an adhesive for bonding a semiconductor chip on a wiring board by flip-chip bonding, and affixing a heat sink to the back surface of the semiconductor chip.

CITATION LIST

Patent Document

Patent Document 1: JP 2009-120826 A

SUMMARY OF THE INVENTION

Problem to be Solved by the Invention

However, since the fillers having high thermal conductivity that are used for conventional die attach films have high hardness, there has been a risk that in a process for thermocompression bonding of a semiconductor chip onto a substrate or in a process for thermocompression bonding of a heat sink onto a semiconductor chip, the back surface of the semiconductor chip, the front surface of the substrate, or the front surface of the heat sink may be partially fractured by the fillers.

Thus, it is an object of the invention to provide a film-like adhesive that can prevent, in a process for thermocompression bonding of a semiconductor chip onto a substrate or in a process for thermocompression bonding of a heat sink onto a semiconductor chip, partial fracture of the back surface of the semiconductor chip, the front surface of the substrate, or the front surface of the heat sink caused by a filler; and a method for producing a semiconductor package using the film-like adhesive.

Means for Solving Problem

In order to solve the problems described above, a film-like adhesive according to the invention includes an epoxy resin (A), an epoxy resin curing agent (B), a phenoxy resin (C), and a heat-conductive filler material (D), in which the heat-conductive filler (D) has an average particle size of 0.1 to 10.0 μm, a compression ratio at break in a microcompression test of 5 to 50% of the average particle size of the sample, a fracture strength in a microcompression test of 0.01 to 2.0 GPa, and a thermal conductivity of 30 W/m·K or higher; a content of the heat-conductive filler material (D) is 10 to 70 vol % with respect to the total amount of the epoxy resin (A), the epoxy resin curing agent (B), the phenoxy resin (C), and the heat-conductive filler material (D); and the film-like adhesive has a thermal conductivity after thermal curing of 1.0 W/m·K or higher.

It is preferable that the film-like adhesive acquires a lowest melt viscosity in the range of 200 to 10,000 Pa·s at a temperature of 80° C. or higher when the temperature is raised from room temperature at a rate of temperature increase of 5° C./min.

In regard to the film-like adhesive, it is preferable that when the heat-conductive filler (D) has a core material coated on the surface with silver, the amount of silver coating is 10 to 95% by weight with respect to the total amount of the heat-conductive filler (D), and the core material is a silicone resin.

It is preferable that the film-like adhesive has a thickness of 1 to 100 μm.

Furthermore, in order to solve the problems described above, a method for producing a semiconductor package according to the invention includes a first step of thermocompression bonding the film-like adhesive and a dicing tape on the back surface of a wafer having at least one semiconductor circuit formed on the front surface, and thereby providing an adhesive layer and a dicing tape on the back surface of the wafer; a second step of simultaneously dicing the wafer and the adhesive layer and thereby obtaining adhesive layer-attached semiconductor chips each including the wafer and the adhesive layer; a third step of detaching the dicing tape from the adhesive layer, and thermocompression bonding the adhesive layer-attached semiconductor chips and a wiring board, with the adhesive layer being interposed therebetween; and a fourth step of thermally curing the adhesive layer.

Effect of the Invention

The film-like adhesive according to the invention and the method for producing a semiconductor package using the film-like adhesive can prevent, in a process for thermocompression bonding of a semiconductor chip onto a substrate or in a process for thermocompression bonding of a heat sink onto a semiconductor chip, partial fracture of the back surface of a semiconductor chip, the front surface of a substrate, or the front surface of a heat sink caused by fillers.

MODE(S) FOR CARRYING OUT THE INVENTION

Figure 1:
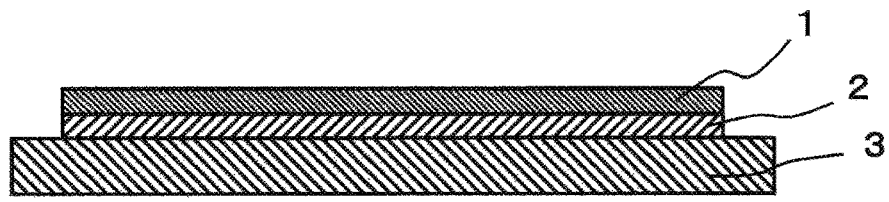
FIG. 1 is an explanatory diagram describing a first step in a method for producing a semiconductor package according to an embodiment of the invention.

Hereinafter, embodiments of the invention will be described in detail.

A film-like adhesive according to an embodiment of the invention includes an epoxy resin (A), an epoxy resin curing agent (B), a phenoxy resin (C), and a heat-conductive filler material (D), in which the heat-conductive filler (D) has an average particle size of 0.1 to 10.0 μm, a compression ratio at break in a microcompression test of 5 to 50% of the average particle size of the sample, a fracture strength in a microcompression test of 0.01 to 2.0 GPa, and a thermal conductivity of 30 W/m·K or higher; a content of the heat-conductive filler material (D) is 10 to 70 vol % with respect to the total amount of the epoxy resin (A), the epoxy resin curing agent (B), the phenoxy resin (C), and the heat-conductive filler material (D); and the film-like adhesive has a thermal conductivity after thermal curing of 1.0 W/m·K or higher. Furthermore, it is preferable that the film-like adhesive according to an embodiment of the invention acquires a lowest melt viscosity in the range of 200 to 10,000 Pa·s at a temperature of 80° C. or higher when the temperature is raised from room temperature at a rate of temperature increase of 5° C./min.

The film-like adhesive according to an embodiment of the invention has a thermal conductivity after thermal curing of 1.0 W/m·K or higher. When the thermal conductivity obtainable after thermal curing of the film-like adhesive is lower than 1.0 W/m·K, the effect of heat dissipation from the semiconductor package is not sufficiently obtained.

Furthermore, it is preferable that the film-like adhesive according to an embodiment of the invention acquires a lowest melt viscosity in the range of 200 to 10,000 Pa-s at a temperature of 80° C. or higher when the temperature is raised from room temperature at a rate of temperature increase of 5° C./min. The lowest melt viscosity is more preferably in the range of 500 to 10,000 Pa-s. When the melt viscosity is higher than 10,000 Pa·s, at the time of thermocompression bonding a semiconductor chip provided with the film-like adhesive onto a wiring board, voids are prone to remain in between the concavo-convexities of the wiring board, and reflow cracks are likely to be produced during a reliability test for the semiconductor package. Furthermore, when the melt viscosity is lower than 200 Pa·s, a problem that the film-like adhesive creeps up or flows out to the front surface of a semiconductor chip or a side surface of a heat sink in a process for thermocompression bonding of the semiconductor chip onto a substrate or in a process for thermocompression bonding of a heat sink, and contaminates the semiconductor package, is likely to occur.

Meanwhile, according to the embodiment of the invention, the lowest melt viscosity is determined by measuring changes in the viscous resistance at a temperature in the range of 20 to 250° C. at a rate of temperature increase of 5° C./min using a rheometer, and calculating the lowest melt viscosity from a temperature-viscous resistance curve thus obtained. Furthermore, the temperature at the time point when the lowest melt viscosity has reached in the temperature-viscous resistance curve is designated as the lowest melt viscosity reaching temperature. The lowest melt viscosity reaching temperature is correlated with the curing rate of the film-like adhesive, and when the lowest melt viscosity reaching temperature is on the lower temperature side, it is implied that the curing rate is faster.

(Epoxy Resin (A))

The epoxy resin (A) included in the adhesive film according to the invention is not particularly limited as long as the resin has epoxy groups.

Regarding the skeleton of the epoxy resin (A), a phenol novolac type, an ortho-cresol novolac type, a dicyclopentadiene type, a biphenyl type, a fluorene bisphenol A type, a triazine type, a naphthol type, a naphthalene diol type, a triphenylmethane type, a tetraphenyl type, a bisphenol A type, a bisphenol F type, a bisphenol AD type, a bisphenol S type, a trimethylolmethane type, or the like can be used.

The epoxy resin (A) is preferably a resin having an epoxy equivalent of 500 g/eq or less, and more preferably 150 to 450 g/eq, in order to increase the crosslinking density of a cured product and consequently to enhance the mechanical strength and heat resistance. Incidentally, according to the invention, the epoxy equivalent means the number of grams of the resin containing 1 gram equivalent of epoxy groups (g/eq).

Regarding the epoxy resin (A), one kind thereof may be used alone, or two or more kinds thereof may be used in combination. In the case of using two or more kinds thereof in combination, for example, it is easy to regulate the viscosity of the composition, and even in a case in which a process of thermocompression bonding the film-like adhesive with a wafer (wafer lamination process) is carried out at a low temperature (preferably, 40 to 80° C.), it is preferable to use an epoxy resin (a1) having a softening point of 50 to 100° C. in combination with an epoxy resin (a2) having a softening point of below 50° C., from the viewpoint that sufficient adhesiveness between the wafer and the film-like adhesive tends to be exhibited.

The epoxy resin (a1) is solid or semi-solid at room temperature and preferably has a softening point of 50 to 100° C., and more preferably 50 to 80° C. When the softening point is below 50° C., the viscosity of the adhesive thus obtainable is decreased, and therefore, it tends to be difficult to maintain the film shape at normal temperature. On the other hand, when the softening point is above 100° C., it tends to be difficult for the film-like adhesive thus obtainable to reach the lowest melt viscosity in the range of 200 to 10,000 Pa·s at a temperature in the range of 80° C. or higher.

The epoxy resin (a1) preferably has a weight average molecular weight of more than 500 and 2,000 or less, and more preferably 600 to 1,200. When the weight average molecular weight is 500 or less, the proportion of monomers or dimers increases, and the crystallinity is increased, so that the film-like adhesive tends to become brittle. Meanwhile, when the weight average molecular weight is more than 2,000, the melt viscosity of the film-like adhesive increases, and therefore, when the film-like adhesive is compressed to a wiring board, the film-like adhesive cannot sufficiently embed the concavo-convexities on the board. Thus, the adhesiveness between the film-like adhesive and the wiring board tends to decrease.

Regarding the skeleton of the epoxy resin (a1) as such, from the viewpoint that the resin has low crystallinity, and a film-like adhesive having satisfactory external appearance is obtained, the skeleton is preferably a triphenylmethane type, a bisphenol A type, a cresol novolac type, an ortho-cresol novolac type, or a dicyclopentadiene type. A triphenylmethane type epoxy resin, a bisphenol A type epoxy resin, or a cresol novolac type epoxy resin is more preferred.

Regarding the epoxy resin (a2), it is preferable that the softening point is below 50° C., and it is more preferable that the softening point is 40° C. or lower, so that even in a case in which a process of thermocompression bonding the film-like adhesive and a wafer (wafer lamination process) is carried out at a low temperature (preferably 40 to 80° C.), the adhesiveness between the wafer and the film-like adhesive is sufficiently exhibited. It is preferable that such an epoxy resin (a2) has a weight average molecular weight of 300 to 500, and more preferably 350 to 450. When the weight average molecular weight is less than 300, the proportion of monomers increases, and thus the crystallinity is increased. Therefore, the film-like adhesive tends to become brittle. On the other hand, when the weight average molecular weight is more than 500, since the melt viscosity increases, the adhesiveness between the wafer and the film-like adhesive tends to decrease at the time of the wafer lamination process.

Regarding the skeleton of such an epoxy resin (a2), from the viewpoint that the crystallinity of the resin is low, and a film-like adhesive having satisfactory external appearance is obtained, the skeleton is preferably bisphenol A type, bisphenol A/F mixed type, a bisphenol F type, or a propylene oxide-modified bisphenol A type, which are oligomer type liquid epoxy resins. From the viewpoint of having low melt viscosity and lower crystallinity, a bisphenol A type epoxy resin or a bisphenol A/F mixed type epoxy resin is more preferred.

Regarding the ratio between the epoxy resin (a1) and the epoxy resin (a2), the mass ratio (a1:a2) is preferably 95:5 to 30:70, and more preferably 70:30 to 40:60. When the content of the epoxy resin (a1) is less than the lower limit, the film tackiness of the film-like adhesive becomes strong, and it tends to become difficult to peel off the film-like adhesive from a cover film or a dicing tape. On the other hand, when the content of the epoxy resin (a1) is more than the upper limit, the viscosity of the composition increases, and the nature of the film-like adhesive thus obtainable tends to become brittle.

(Epoxy Resin Curing Agent (B))

Regarding the epoxy resin curing agent (B) used in the invention, a known curing agent such as an amine compound, an acid anhydride compound, or a polyhydric phenol compound can be used; however, preferred is a latent curing agent that exhibits curing performance at a predetermined temperature higher than or equal to normal temperature, for example, a temperature higher than or equal to the temperature at which the epoxy resin (A) exhibits necessary tacky adhesiveness, and also exhibits fast curing performance. Regarding the latent curing agent, dicyandiamide, an imidazole compound, a hydrazide compound, a boron trifluoride-amine complex, an amineimide, a polyamine salt or a modification product thereof, and a microcapsule type agent can also be used. These can be used singly or as mixtures of two or more kinds thereof. By using a latent curing agent, a composition for a film-like adhesive capable of long-term storage at room temperature and having high storage stability can be provided. The amount of use of the epoxy resin curing agent (B) is usually in the range of 0.5 to 50% by mass with respect to the epoxy resin (A). Furthermore, in the case of using dicyandiamide or the like as the curing agent, it is preferable to use imidazole as a catalyst.

(Phenoxy Resin (C))

The phenoxy resin (C) used in the invention is used in order to impart sufficient adhesiveness and film-formability (film-forming properties) to the film-like adhesive. Since the phenoxy resin has a structure similar to the structure of an epoxy resin, the phenoxy resin has satisfactory compatibility, low resin melt viscosity, and satisfactory adhesiveness. A phenoxy resin is a thermoplastic resin usually having a molecular weight of 10,000 or more, which is obtainable from bisphenol such as bisphenol A and epichlorohydrin. When a phenoxy resin is incorporated, it is effective to solve problems such as tackiness at normal temperature and brittleness. Regarding preferred phenoxy resins, commercially available phenoxy resins such as 1256 (bisphenol A type phenoxy resin, manufactured by Mitsubishi Chemical Corporation), YP-70 (bisphenol A/F type phenoxy resin, manufactured by NSCC Epoxy Manufacturing Co., Ltd.), FX-316 (bisphenol F type phenoxy resin, manufactured by NSCC Epoxy Manufacturing Co., Ltd.), and FX-280S (cardo skeleton type phenoxy resin, manufactured by NSCC Epoxy Manufacturing Co., Ltd.) may be used as the phenoxy resin (C).

(Heat-Conductive Filler Material (D))

The heat-conductive filler material (D) used in the invention has an average particle size of 0.1 to 10.0 μm. When the average particle size of the heat-conductive filler material is less than 0.1 μm, the specific surface area of the heat-conductive filler material becomes large. Therefore, the heat dissipation route by the heat-conductive filler (D) inside the film-like adhesive is lengthened, and the heat dissipation efficiency becomes poor. When the average particle size of the heat-conductive filler material is more than 10.0 μm, at the time of producing a thin type film-like adhesive with a coating machine such as a roll knife coater, the filler particles are likely to serve as starting points and generate streaks on the surface of the film-like adhesives.

Incidentally, according to the invention, the average particle size of the heat-conductive filler material (D) means the particle size of a cumulative 50% when the total volume of particles in the particle size distribution is designated as 100%. The average particle size can be determined from a cumulative curve of the volume fractions of particle size of a particle size distribution measured by a laser diffraction scattering method (measurement conditions: dispersing medium-sodium hexametaphosphate, laser wavelength: 780 nm, measurement apparatus: MicroTrac MT3300EX). Furthermore, according to the invention, a spherical shape means a true sphere or an approximately true sphere with roundness and substantially without any corners.

Furthermore, the heat-conductive filler material (D) has a compression ratio at break in a microcompression test of 5 to 50% of the average particle size of the sample. When the compression ratio at break is lower than 5% of the average particle size of the sample, the heat-conductive filler material (D) is hard and is not easily deformable. Therefore, in a process for thermocompression bonding of a semiconductor chip onto a substrate or in a process for thermocompression bonding of a heat sink onto a semiconductor chip, the back surface of the semiconductor chip, the front surface of the substrate, or the front surface of the heat sink is partially fractured by the filler. When the compression ratio at break is higher than 50% of the average particle size, the shape of the heat-conductive filler is likely to be deformed in a process for thermocompression bonding of a semiconductor chip onto a substrate or in a process for thermocompression bonding of a heat sink onto a semiconductor chip. The thickness of the film-like adhesive becomes smaller than the original thickness, and the film-like adhesive can creep up or flow out to the upper part of the semiconductor chip or to the side surface of the heat sink.

Furthermore, the heat-conductive filler material (D) has a fracture strength of 0.01 to 2.0 GPa as obtained in a microcompression test. When the fracture strength in a microcompression test is less than 0.01 GPa, the heat-conductive filler is likely to be fractured in a process of dispersing the heat-conductive filler in a binder resin using a planetary mixer or the like in a production process for the film-like adhesion, and thermal conduction performance of the film-like adhesive cannot be obtained. When the fracture strength in a microcompression test is higher than 2.0 GPa, the heat-conductive filler material (D) is hard and is not easily deformable. Therefore, in a process for thermocompression bonding of a semiconductor chip onto a substrate or in a process for thermocompression bonding of the heat sink onto a semiconductor chip, the back surface of the semiconductor chip, the front surface of the substrate, or the front surface of the heat sink is partially fractured by the filler.

The compression ratio at break and the fracture strength in a microcompression test of the heat-conductive filler material (D) can be measured as follows. An appropriate amount of a sample of the heat-conductive filler material (D) is sprayed on a stage of a microcompression testing machine, and while the particles are observed with an attached optical microscope, the average particle size of the sample is measured. Next, the sample is compressed in air at room temperature with a planar indenter made of diamond (50 µmφ) at a loading rate of 0.89 mN/s. In a load-indentation displacement curve diagram thus obtained, the point at which the displacement rapidly increases is considered as the fracture of the sample, and the displacement at that time point is designated as the displacement at break. Thus, the compression ratio at break (%) is calculated by the following Formula (1).

Compression ratio at break=Amount of displacement at break÷average particle size of sample (1)

Furthermore, the fracture strength is calculated by the following Formula (2) from the fracture load obtained at that time point.

Fracture strength=(2.8×fracture load)÷π(ratio of circumference to diameter)×average particle size of sample$^2$ (2)

Furthermore, the thermal conductivity of the heat-conductive filler material (D) is 30 W/m·K or higher. When the thermal conductivity of the heat-conductive filler material (D) is not 30 W/m·K or higher, the film-like adhesive cannot contribute sufficiently to heat dissipation of the semiconductor package.

Regarding such a heat-conductive filler material (D), a filler material having the surface of the core material coated with metal or ceramic can be used.

Examples of the core material include a silicone resin, a fluororesin such as polytetrafluoroethylene, an acrylic resin such as polymethyl methacrylate, and a cross-linked product of benzoguanamine or melamine and formaldehyde.

Regarding the metal for coating, gold, silver, copper, nickel, aluminum, zinc, tin, lead, solder, indium, palladium, and the like can be used singly or in combination of two or more kinds thereof. Regarding the ceramic, aluminum oxide, aluminum nitride, magnesium oxide, boron nitride, aluminum hydroxide, silicon carbide, and the like can be used singly or in combination of two or more kinds thereof.

It is preferable that the heat-conductive filler material (D) is silicone resin particles coated with silver, from the viewpoints of heat dissipation properties and flexibility. The silicone resin particles may be particles formed from an organopolysiloxane, which is obtained by polymerizing an organochlorosilane such as methylchlorosilane, trimethyltrichlorosilane, or dimethyldichlorosilane, or may be silicone resin particles formed from a silicone resin having a structure obtained by further three-dimensionally crosslinking this organopolysiloxane as the basic skeleton.

Furthermore, various functional groups can be introduced into the structure of the silicone resin particles, and examples of the functional groups that can be introduced include an epoxy group, an amino group, a methoxy group, a phenyl group, a carboxyl group, a hydroxyl group, an alkyl group, a vinyl group, and a mercapto group. However, the functional group is not limited to these.

Meanwhile, in the embodiment, another low stress modifying agent may be added to these silicone resin particles to the extent that does not impair the characteristics. Examples of the other low stress modifying agent that can be used in combination include a butadiene-styrene rubber, a butadiene-acrylonitrile rubber, a polyurethane rubber, a polyisoprene rubber, an acrylic rubber, a fluorine rubber, and liquid synthetic rubbers such as a liquid organopolysiloxane and a liquid polybutadiene; however, the examples are not limited to these.

The amount of silver coating is preferably 10 to 95% by weight with respect to the total amount of the heat-conductive filler (D). When the amount of silver coating is less than 10% by weight, a heat dissipation effect cannot be easily obtained. Furthermore, when the amount of silver coating is higher than 95%, it is difficult to adjust the compression ratio at break in a microcompression test to be 5 to 50% of the average particle size of the sample, and to adjust the fracture strength in a microcompression test to be 0.01 to 2.0 GPa. Also, there is a risk that in a process for thermocompression bonding of a semiconductor chip onto a substrate or in a process for thermocompression bonding of a heat sink onto a semiconductor chip, the back surface of the semiconductor chip, the front surface of the substrate, or the front surface of the heat sink may be partially fractured by the filler.

The term "coating" as used herein may refer to covering of the entire surface of the core material, or may also refer to partial covering.

Furthermore, coating can be carried out by plating the surface of resin particles with a metal thin film. Regarding the method for plating, methods such as electroless plating, vacuum deposition, and ion sputtering are used.

The content of the heat-conductive filler material (D) is 10 to 70 vol %, and more preferably 40 to 70 vol %, with respect to the total amount of the epoxy resin (A), the epoxy resin curing agent (B), the phenoxy resin (C), and the heat-conductive filler material (D). This is because the lowest melt viscosity value is controlled by the amount of incorporation of the heat-conductive filler material (D). When the amount of incorporation of the heat-conductive filler material (D) is larger than 70 vol %, the lowest melt viscosity value becomes large, and at the time of thermocompression bonding a semiconductor chip provided with the film-like adhesive onto a wiring board, voids are likely to remain between the concavities and convexities of the wiring board, and the film brittleness increases. Therefore, reflow cracks are likely to be produced in a reliability test for the semiconductor package. When the amount of incorporation is less than 10% by mass, the lowest melt viscosity value becomes small, and a problem that in a process for thermocompression bonding of a semiconductor chip onto a substrate or in a process for thermocompression bonding of a heat sink, the film-like adhesive creeps up or flows out to the front surface of the semiconductor chip or the side surface of the heat sink, and contaminates the semiconductor package, is likely to occur.

The composition for the film-like adhesive of the invention may further include additives such as a viscosity adjusting agent, an oxidation inhibitor, a flame retardant, a colorant, and a stress reliever such as a butadiene-based rubber or a silicone rubber, to the extent that does not impair the effects of the invention in addition to the epoxy resin (A), the epoxy resin curing agent (B), the phenoxy resin (C), and the heat-conductive filler material (D).

One suitable embodiment of the method for producing a film-like adhesive of the invention is a method of coating a composition for a film-like adhesive on one surface of a release-treated base material film and subjecting the coated base material film to heating and drying; however, the production method is not particularly limited to this method. The release-treated base material film may be any film that functions as a cover film for the film-like adhesive thus obtainable, and any known release-treated base material film can be employed as appropriate. Examples thereof include a release-treated polypropylene (PP) film, a release-treated polyethylene (PE) film, and a release-treated polyethylene terephthalate (PET) film. Regarding the coating method, any known method can be employed as appropriate, and examples include methods using a roll knife coater, a gravure coater, a die coater, a reverse coater, or the like.

Regarding the film-like adhesive of the invention obtained as such, a film-like adhesive having a thickness of 1 to 100 μm is preferred. When the thickness is less than 1 μm, the concavities and convexities of the surface of the wiring board and the semiconductor chip cannot be sufficiently embedded, and there is a tendency that sufficient adhesiveness cannot be secured. On the other hand, when the thickness is higher than 100 μm, it is difficult to remove the organic solvent at the time of production, and therefore, the amount of residual solvent becomes large. Thus, the film tackiness tends to become strong.

Furthermore, the lowest melt viscosity of the invention can be achieved by a combination of the composition and the mixing ratio as described above, and can also be achieved by intentionally performing a preliminary heat treatment after film production, thereby partially performing a curing reaction of the epoxy resin, and thus increasing the melt viscosity. Then, the occurrence of voids at the time of high temperature thermal curing in a semiconductor assembling process can be suppressed. The temperature for the preliminary heat treatment at this time is preferably 80 to 150° C., more preferably 100 to 130° C. The time for the preliminary heat treatment is preferably 5 to 300 minutes, and more preferably 30 to 200 minutes.

Next, a suitable embodiment of the method for producing a semiconductor package of the invention will be described in detail with reference to the drawings. Meanwhile, in the following description and drawings, a same symbol will be assigned to the same or equivalent elements, and any overlapping description will not be repeated. FIG. 1 to FIG. 7 are schematic vertical cross-sectional views illustrating one suitable embodiment of various steps of the method for producing a semiconductor package of the invention.

In the method for producing a semiconductor package of the invention, first, as illustrated in FIG. 1 as a first step, the film-like adhesive of the invention is thermocompression bonded to the back surface of a wafer 1 having at least one semiconductor circuit formed on the front surface, and thus an adhesive layer 2 is provided. Next, a dicing tape 3 is affixed to the wafer 1, with the adhesive layer 2 being interposed therebetween. At this time, a manufactured product in which the adhesive layer 2 and the dicing tape 3 have been integrated in advance may be thermocompression bonded by a single time. The dicing tape 3 is not particularly limited, and any known dicing tape can be used as appropriate. Regarding the wafer 1, a wafer having at least one semiconductor circuit formed on the surface can be used as appropriate, and examples thereof include a silicon wafer, a SiC wafer, and a GaAs wafer. Regarding the adhesive layer 2, the film-like adhesive of the invention may be used as a single layer alone or may be used as a laminate of two or more layers. Regarding a method of providing such an adhesive layer 2 on the back surface of the wafer 1, any method capable of laminating the film-like adhesive on the back surface of the wafer 1 can be employed as appropriate, and examples include a method of pasting the film-like adhesive onto the back surface of the wafer 1, and then, in the case of laminating two or more layers, laminating the film-like adhesive in sequence until a desired thickness is obtained; and a method of laminating the film-like adhesive in advance to an objective thickness, and then pasting the laminate to the back surface of the wafer 1. Furthermore, the apparatus used at the time of providing such an adhesive layer 2 on the back surface of the wafer 1 is not particularly limited, and for example, known apparatuses such as a roll laminator and a manual laminator can be used as appropriate.

Figure 2:
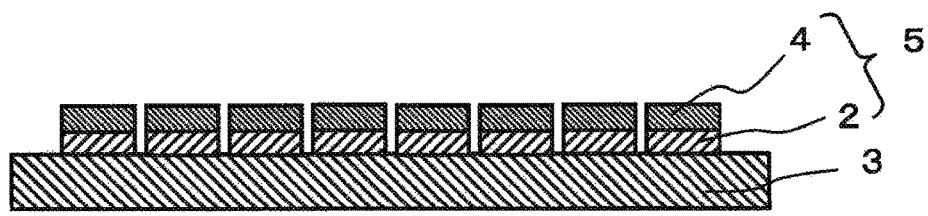
FIG. 2 is an explanatory diagram describing a second step in the method for producing a semiconductor package according to an embodiment of the invention.

Next, in regard to the method for producing a semiconductor package of the invention, as illustrated in FIG. 2 as a second step, the wafer 1 and the adhesive layer 2 are diced simultaneously, and thereby an adhesive layer-attached semiconductor chip 5 including a semiconductor chip 4 and the adhesive layer 2 is obtained. The apparatus used for dicing is not particularly limited, and any known dicing apparatus can be used as appropriate.

Figure 3:
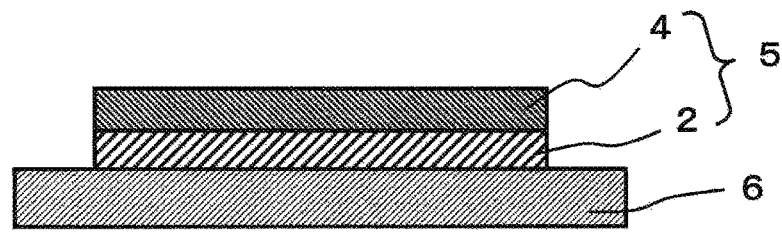
FIG. 3 is an explanatory diagram describing a third step in the method for producing a semiconductor package according to an embodiment of the invention.

Next, in regard to the method for producing a semiconductor package of the invention, as illustrated in FIG. 3 as a third step, the dicing tape 3 is detached from the adhesive layer 2, the adhesive layer-attached semiconductor chip 5 and a wiring board 6 are thermocompression bonded, with the adhesive layer 2 being interposed therebetween, and thereby the semiconductor chip 4 is packaged on the wiring board 6. Regarding the wiring board 6, a substrate having a semiconductor circuit formed on the surface can be used as appropriate, and examples thereof include a printed circuit board (PCB), various lead frames, and a substrate on which electronic components such as a resistance element and a condenser mounted on the substrate surface.

The method of packaging the semiconductor chip 4 as such is not particularly limited, and any conventional method capable of adhering the adhesive layer-attached semiconductor chip 5 to the wiring board 6 or an electronic component mounted on the surface of the wiring board 6 by utilizing the adhesive layer 2, can be employed as appropriate. Examples of such a packaging method include conventionally known heating and pressing methods such as a method of using a packaging technology using a flip chip bonder having a function of heating from the upper part; a method of using a die bonder having a function of heating only from the lower part; and a method of using a laminator. As such, by packaging the semiconductor chip 4 on the wiring board 6 by interposing the adhesive layer 2 formed from the film-like adhesive of the invention, the adhesive layer 2 (film-like adhesive) can be made to conform to the concavities and convexities on the wiring board 6 produced by electronic components. Therefore, the wafer 1 and the wiring board 6 can be fixed by adhering each other closely.

Next, in regard to the method for producing a semiconductor package of the invention, as a fourth step, the adhesive layer 2 is thermally cured. The temperature for the thermal curing is not particularly limited as long as the temperature is higher than or equal to the thermal curing initiation temperature of the film-like adhesive (adhesive layer 2), and the temperature is dependent on the type of the resin used. It is not to be said in general; however, for example, the temperature is preferably higher than 120° C. and 180° C. or lower, and from the viewpoint of curing at a higher temperature enables curing in a shorter time, the thermal curing temperature is more preferably 140 to 180° C. When the temperature is lower than the thermal curing initiation temperature, thermal curing does not proceed sufficiently, and the strength of the adhesion layers 2 tends to decrease. On the other hand, when the thermal curing initiation temperature is higher than 180° C., there is a tendency that the epoxy resin, curing agent, additives, and the like in the film-like adhesive volatilize during the curing process, and the film-like adhesive is likely to foam. Furthermore, the time for the curing treatment is preferably, for example, 10 to 120 minutes. According to the invention, the film-like adhesive can be cured in a short time period by thermally curing the film-like adhesive at high temperature, and a semiconductor package in which the wiring board 6 and the wafer 1 are strongly adhered, without any voids generated therein, even if the film-like adhesive is cured at a high temperature, can be obtained.

Figure 4:
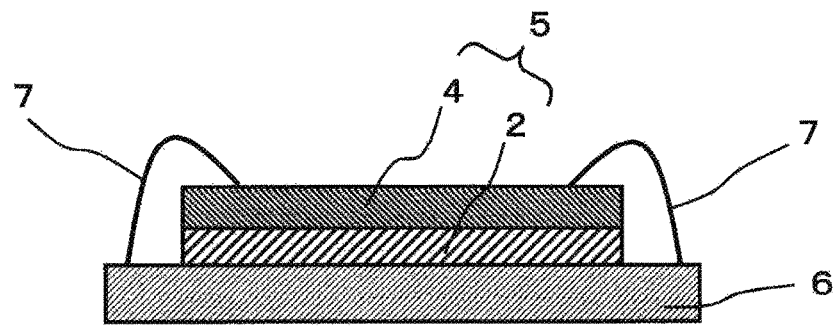
FIG. 4 is an explanatory diagram describing a fifth step in the method for producing a semiconductor package according to an embodiment of the invention.

Next, in the method for producing a semiconductor package of the invention, as illustrated in FIG. 4 as a fifth step, it is preferable that the wiring board 6 and the semiconductor chip 4 are connected via bonding wires 7. Such a connection method is not particularly limited, and any conventionally known method, for example, a method of wire bonding technique or a method of Tape Automated Bonding (TAB) technique, can be employed as appropriate.

Figure 5:
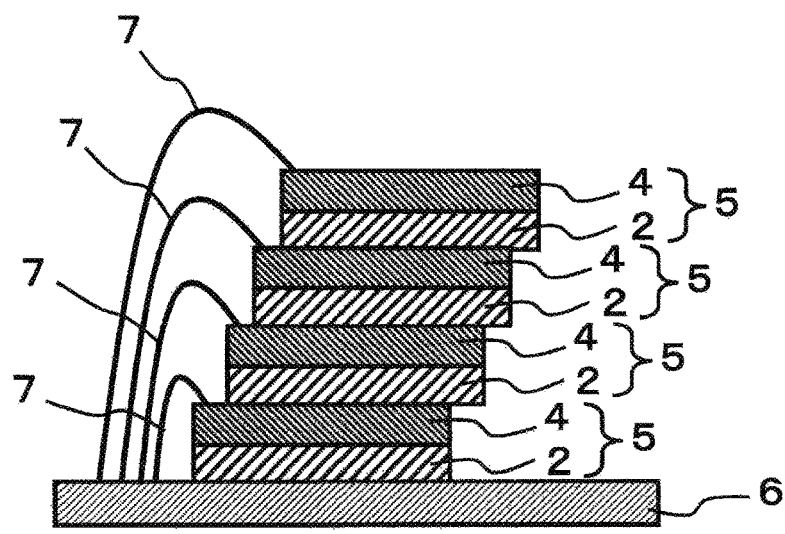
FIG. 5 is a cross-sectional view schematically illustrating a packaging structure of a semiconductor chip using the film-like adhesive according to an embodiment of the invention.
Figure 6:
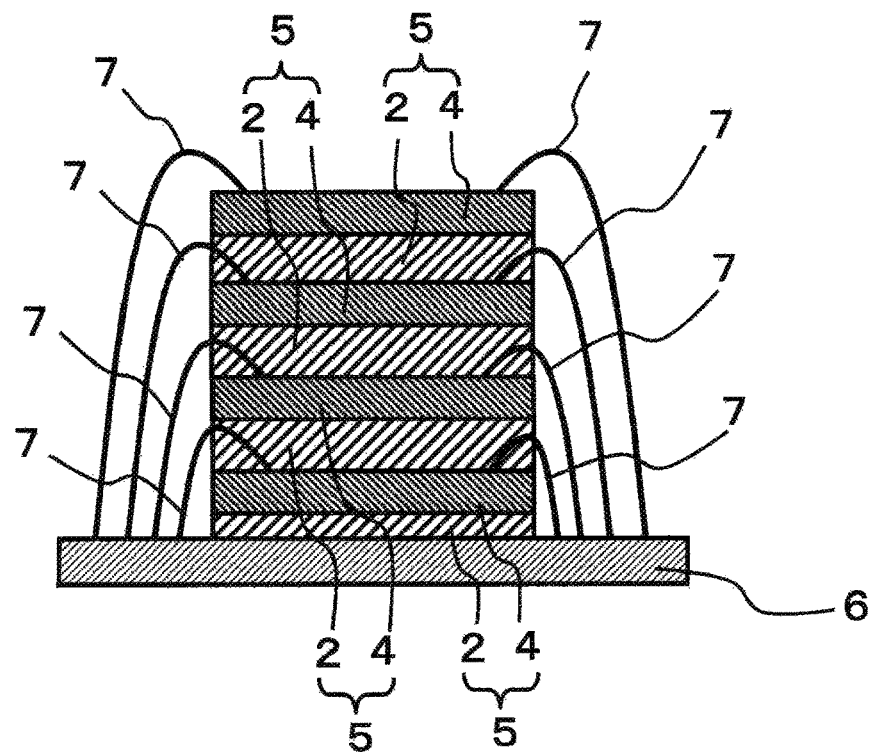
FIG. 6 is a cross-sectional view schematically illustrating another packaging structure of a semiconductor chip using the film-like adhesive according to an embodiment of the invention.

Furthermore, a plurality of units may be stacked by thermocompression bonding and thermally curing other adhesive layer-attached semiconductor chips 5 on the surface of the mounted semiconductor chip 4, and connecting the semiconductor chips to the wiring board 7 again by the wire bonding technique. Examples include a method of stacking semiconductor chips 4 in a shifted manner as illustrated in FIG. 5, and a method of stacking semiconductor chips while embedding bonding wires 7 by making the adhesion layers 2 after the second layer thick as illustrated in FIG. 6.

Figure 7:
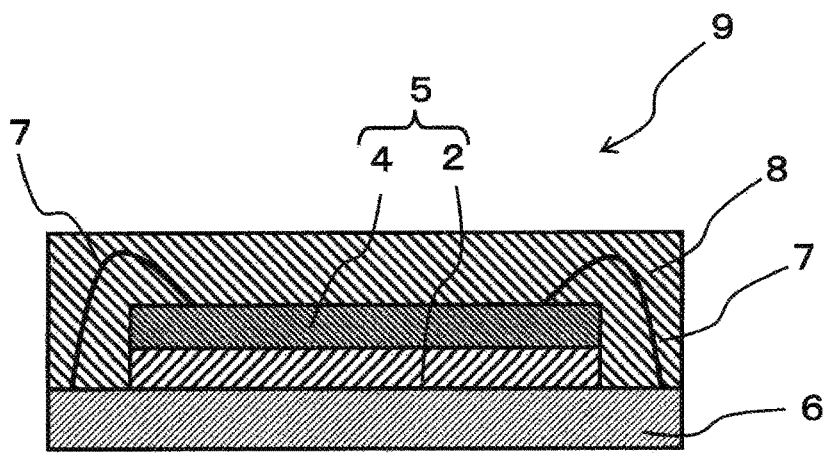
FIG. 7 is a cross-sectional view schematically illustrating a structure of the semiconductor package according to an embodiment of the invention.

In regard to the method for producing a semiconductor package of the invention, as illustrated in FIG. 7, it is preferable that the wiring board 6 and the semiconductor chip 4 are encapsulated by an encapsulating resin 8, and a semiconductor package 9 of the invention can be obtained as such. The encapsulating resin 8 is not particularly limited, and any known encapsulating resin that can be used for the production of semiconductor packages can be used as appropriate. Furthermore, the method for encapsulation with an encapsulating resin 8 is not particularly limited, and any known method can be employed as appropriate.

According to such a method for producing a semiconductor package of the invention, in a process for thermocompression bonding of a semiconductor chip onto a substrate, partial fracture of the back surface of the semiconductor chip or the front surface of the substrate caused by the heat-conductive filler material (D) can be prevented.

Figure 8:
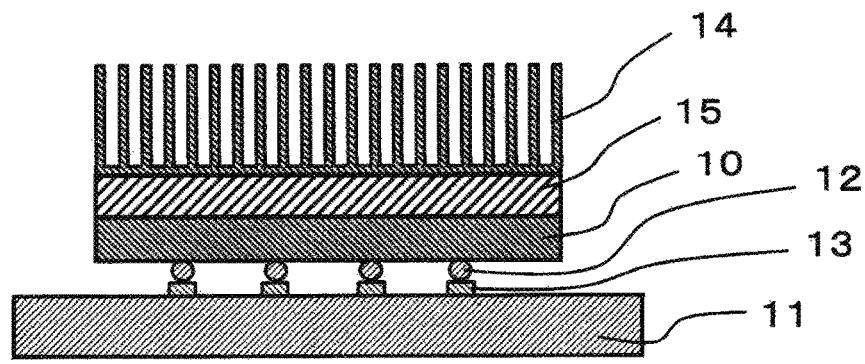
FIG. 8 is a cross-sectional view schematically illustrating another packaging structure of a semiconductor chip using the film-like adhesive according to an embodiment of the invention.

Furthermore, the film-like adhesive of the invention can also be used as an adhesive for flip-chip connecting a semiconductor chip 10 to a substrate 11 and affixing a heat sink 14 to the back surface of the semiconductor chip 10, as illustrated in FIG. 8. Specifically, bumps 12 that are formed as connections on the circuit face side of the semiconductor chip 10 are brought into contact with conductive materials 13 for joining (solder or the like) adhered to connection pads of the substrate 11, and the bumps 12 and the conductive materials 13 are melted while being pressed. Thereby, the semiconductor chip 10 and the substrate 11 are flip-chip connected. Subsequently, a film-like adhesive 15 of the invention is affixed to the back surface of the semiconductor chip 10 that has been flip-chip connected, and a heat sink 14 is stuck thereon. Then, the film-like adhesive 15 is cured. At this time, in the process for thermocompression bonding of the heat sink 14 onto the semiconductor chip 10, partial fracture of the back surface of the semiconductor chip 10 or the front surface of the heat sink 14 caused by the heat-conductive filler material (D) can be prevented.

Hereinafter, the invention will be described in more detail based on Examples and Comparative Examples; however, the invention is not limited to the following Examples.

Example 1

First, 58 parts by mass of a triphenylmethane type epoxy resin (trade name: EPPN-501H, weight average molecular weight: 1,000, softening point: 55° C., solid, epoxy equivalent: 167, manufactured by Nippon Kayaku Co., Ltd.), 26 parts by mass of a bisphenol A type epoxy resin (trade name: YD-128, weight average molecular weight: 400, softening point: 25° C. or lower, liquid, epoxy equivalent: 190, manufactured by NSCC Epoxy Manufacturing Co., Ltd.), 15 parts by mass of a bisphenol A type phenoxy resin (trade name: YP-50, weight average molecular weight: 70,000, Tg: 84° C., manufactured by NSCC Epoxy Manufacturing Co., Ltd.), and 80 parts by mass of methyl ethyl ketone as a solvent were heated and stirred in a 500-ml separable flask at a temperature of 110° C. for 2 hours. Thus, a resin varnish was obtained.

Next, 190 parts by mass of this resin varnish was transferred into a 800-ml planetary mixer, and 240 parts by mass of a silver-coated silicone resin filler (trade name: SCO280-SF, average particle size 2.0 μm, amount of silver coating 80% by mass, specific gravity 4.3 g/cm$^3$, thermal conductivity 400 W/m·K, displacement at break 0.8 μm (compression ratio at break 40%), fracture strength 0.24 GPa, manufactured by Mitsubishi Materials Corporation) as a heat-conductive filler material (D) and 2 parts by mass of an imidazole type curing agent (trade name: 2PHZ-PW, manufactured by SHIKOKU CHEMICALS CORPORATION) were added to the resin varnish. The mixture was stirred and mixed for one hour at room temperature and then was degassed in a vacuum. Thus, a mixed varnish was obtained.

Next, the mixed varnish thus obtained was applied on a release-treated PET film having a thickness of 38 μm, and the mixed varnish was heated and dried for 10 minutes at 130° C. Thus, a film-like adhesive according to Example 1 having a thickness of 15 μm was obtained.

Example 2

A film-like adhesive according to Example 2 was obtained in the same manner as in Example 1, except that 362 parts by mass of a silver-coated silicone resin filler (trade name: SCO280-SF, average particle size 2.0 μm, amount of silver coating 80% by mass, specific gravity 4.3 g/cm$^3$, thermal conductivity 400 W/m·K, displacement at break 0.8 μm (compression ratio at break 40%), fracture strength 0.24 GPa, manufactured by Mitsubishi Materials Corporation) was used.

Example 3

A film-like adhesive according to Example 3 was obtained in the same manner as in Example 1, except that 550 parts by mass of a silver-coated silicone resin filler (trade name: SCO280-SF, average particle size 2.0 μm, amount of silver coating 80% by mass, specific gravity 4.3 g/cm$^3$, thermal conductivity 400 W/m·K, displacement at break 0.8 μm (compression ratio at break 40%), fracture strength 0.24 GPa, manufactured by Mitsubishi Materials Corporation) was used.

Example 4

A film-like adhesive according to Example 4 was obtained in the same manner as in Example 1, except that 240 parts by mass of a silver-coated silicone resin filler (trade name: SC0475-SF, average particle size 4.0 μm, amount of silver coating 75% by mass, specific gravity 4.1 g/cm$^3$, thermal conductivity 400 W/m·K, displacement at break 1.4 μm (compression ratio at break 35%), fracture strength 0.26 GPa, manufactured by Mitsubishi Materials Corporation) was used as the heat-conductive filler material (D).

Example 5

A film-like adhesive according to Example 5 was obtained in the same manner as in Example 1, except that 240 parts by mass of a silver-coated silicone resin filler (trade name: SC0475-SF, average particle size 4.0 μm, amount of silver coating 75% by mass, specific gravity 4.1 g/cm$^3$, thermal conductivity 400 W/m·K, displacement at break 1.4 μm (compression ratio at break 35%), fracture strength 0.26 GPa, manufactured by Mitsubishi Materials Corporation) was used as the heat-conductive filler material (D).

Example 6

A film-like adhesive according to Example 6 was obtained in the same manner as in Example 1, except that 330 parts by mass of a gold-nickel-coated resin filler (trade name: AU203A, average particle size 3.0 μm, specific gravity 6.0 g/cm$^3$, thermal conductivity 300 W/m·K, displacement at break 1.5 μm (compression ratio at break 50%), fracture strength 0.35 GPa, manufactured by SEKISUI CHEMICAL CO., LTD.) was used as the heat-conductive filler material (D).

Comparative Example 1

A film-like adhesive according to Comparative Example 1 was obtained in the same manner as in Example 1, except that 1,060 parts by mass of a silver-coated silicone resin filler (trade name: SC0475-SF, average particle size 4.0 μm, amount of silver coating 75% by mass, specific gravity 4.1 g/cm$^3$, thermal conductivity 400 W/m·K, displacement at break 1.4 μm (compression ratio at break 35%), fracture strength 0.26 GPa, manufactured by Mitsubishi Materials Corporation) was used as the heat-conductive filler material (D).

Comparative Example 2

A film-like adhesive according to Comparative Example 2 was obtained in the same manner as in Example 1, except that 30 parts by mass of a silver-coated silicone resin filler (trade name: SC0475-SF, average particle size 4.0 μm, amount of silver coating 75% by mass, specific gravity 4.1 g/cm$^3$, thermal conductivity 400 W/m·K, displacement at break 1.4 μm (compression ratio at break 35%), fracture strength 0.26 GPa, manufactured by Mitsubishi Materials Corporation) was used as the heat-conductive filler material (D).

Comparative Example 3

A film-like adhesive according to Comparative Example 3 was obtained in the same manner as in Example 1, except that 185 parts by mass of a silica filler (trade name: FB-3SDX, average particle size 3.0 μm, specific gravity 2.2 g/cm$^3$, thermal conductivity 1.0 W/m·K, displacement at break 0.1 μm (compression ratio at break 3%), fracture strength 2.4 GPa, manufactured by Denka Company Limited) was used.

Comparative Example 4

A film-like adhesive of Comparative Example 4 was obtained in the same manner as in Example 1, except that 100 parts by mass of a silicone filler (trade name: MSP-SN05, average particle size 0.5 μm, specific gravity 1.2 g/cm$^3$, thermal conductivity 0.2 W/m·K, displacement at break 1.5 μm (compression ratio at break 38%), fracture strength 0.28 GPa, manufactured by Nikko Rika Corporation) was used.

Comparative Example 5

A film-like adhesive according to Comparative Example 5 was obtained in the same manner as in Example 1, except that 600 parts by mass of a silver filler (trade name: Ag-4-8F, average particle size 2.0 μm, specific gravity 10.5 g/cm$^3$, thermal conductivity 429 W/m·K, displacement at break 0.4 μm (compression ratio at break 20%), fracture strength 2.1 GPa, manufactured by Mitsubishi Materials Corporation) was used.

Comparative Example 6

A film-like adhesive of Comparative Example 6 was obtained in the same manner as in Example 1, except that 280 parts by mass of an aluminum nitride filler (trade name: HF-01, average particle size 1.0 μm, specific gravity 3.3 g/cm³, thermal conductivity 200 W/m·K, displacement at break 0.1 μm (compression ratio at break 10%), fracture strength 3.0 GPa, manufactured by Tokuyama Corporation) was used.

The displacement at break, compression ratio at break, and fracture strength of each of the heat-conductive fillers used in the film-like adhesives according to Examples and Comparative Examples were measured as follows. An appropriate amount of each of the heat-conductive fillers was sprayed as a sample on a stage of a microcompression testing machine (trade name: MCTW-500, manufactured by SHIMADZU CORPORATION), and while the particles were observed with an attached optical microscope, the average particle size of the sample was measured. Next, the sample was compressed with a planar indenter (50 μmϕ) made of diamond in air at room temperature at a loading rate of 0.89 mN/s. In a load-indentation displacement curve diagram thus obtained, the point at which the displacement rapidly increased was considered as the fracture of the filler particles, and the displacement at that time point was designated as the displacement at break. Thus, the compression ratio at break (%) was calculated by the following Formula (1).

$$\text{Compression ratio at break} = \text{Amount of displacement at break} \div \text{average particle size of sample} \quad (1)$$

Furthermore, the fracture strength was calculated by the following Formula (2) from the fracture load obtained at that time point.

$$\text{Fracture strength} = (2.8 \times \text{fracture load}) \div \pi (\text{ratio of circumference to diameter}) \times \text{average particle size of sample}^2 \quad (2)$$

Furthermore, for the film-like adhesives according to Examples and Comparative Examples, various measurements and evaluations as described below were carried out. The results are presented in Tables 1 and 2.

(Measurement of Lowest Melt Viscosity)

Each of the film-like adhesives according to various Examples and Comparative Examples was cut into a size of 5.0 cm×5.0 cm, and the film-like adhesive sheets were laminated. The sheets were laminated together with a hand roller on a hot plate as a stage at 70° C., and thereby a specimen having a thickness of about 1.0 mm was obtained. For this specimen, changes in the viscous resistance were measured using a rheometer (RS6000, manufactured by Haake Technik GmbH) over a temperature range of 20 to 250° C. at a rate of temperature increase of 5° C./min, and from a temperature-viscous resistance curve thus obtained, the lowest melt viscosity reaching temperature and the lowest melt viscosity (Pa·s) were calculated.

(Thermal Conductivity)

Each of the film-like adhesives according to various Examples and Comparative Examples was cut into a rectangle that measured 50 mm or more on each side, and samples thus cut out were superposed to a thickness of 5 mm or larger. The superposed samples were placed on a disk-shaped mold having a diameter of 50 mm and a thickness of 5 mm, and the samples were heated using a compression press molding machine for 10 minutes at a temperature of 150° C. and a pressure of 2 MPa and then taken out. Subsequently, the superposed samples were further heated in a dryer for one hour at a temperature of 180° C. to thereby thermally cure the film-like adhesive. Thus, a disk-shaped specimen having a diameter of 50 mm and a thickness of 5 mm was obtained. For this specimen, the thermal conductivity (W/m·K) was measured by a heat flow meter method (according to JIS A1412) using a thermal conductivity measuring apparatus (trade name: HC-110, manufactured by EKO Instruments B.V.).

(Filler Damage Evaluation)

First, a dicing tape (trade name: K-13, manufactured by Furukawa Electric Co., Ltd.) and a dicing frame (trade name: DTF2-8-1H001, manufactured by DISCO Corporation) were laminated together with a dummy silicon wafer (8-inch size, thickness 625 μm), and the assembly was diced into a size of 2.0×2.0 mm with a dicing apparatus (trade name: DFD-6340, manufactured by DISCO Corporation) equipped with a biaxial dicing blade (Z1: NBC-ZH2030-SE (DD), manufactured by DISCO Corporation/Z2: NBC-ZH127F-SE (BB), manufactured by DISCO Corporation). The surface of this dummy silicon chip was observed with a scanning electron microscope (JSM-7900F manufactured by JEOL Ltd.), and it was confirmed that there was no scratch on the surface.

Next, each of the film-like adhesives according to Examples and Comparative Examples were superposed on a dummy silicon wafer (8-inch size, thickness 100 μm) at a temperature of 70° C. and a pressure of 0.3 MPa using a manual laminator (trade name: FM-114, manufactured by TECHNOVISION, INC.). Next, a dicing tape (trade name: K-13, manufactured by Furukawa Electric Co., Ltd.) and a dicing frame (trade name: DTF2-8-1H001, manufactured by DISCO Corporation) were laminated on the surface on the opposite side of the dummy silicon wafer in the film-like adhesive using the same manual laminator at room temperature and a pressure of 0.3 MPa, and thus a specimen was obtained. This specimen was diced into a size of 1.0×1.0 mm using a dicing apparatus (trade name: DFD-6340, manufactured by DISCO Corporation) equipped with a biaxial dicing blade (Z1: NBC-ZH2030-SE (DD), manufactured by DISCO Corporation/Z2: NBC-ZH127F-SE (BB), manufactured by DISCO Corporation). Thus, a film-like adhesive-attached semiconductor chip was produced.

Next, the film-like adhesive-attached semiconductor chip was compression-bonded on the dummy silicon wafer prepared in advance and having a size of 2.0×2.0 mm by applying excess pressure, in a die bonder (trade name: DB-800, manufactured by Hitachi High-Technologies Corporation) under the conditions of normal temperature, a pressure of 1.0 MPa (load 4,000 gf), and a time of 1.0 second. The semiconductor chip thus compression-bonded was introduced into a glass container containing 10 ml of methyl ethyl ketone, and the film-like adhesive composition was dissolved and cleaned by ultrasonic cleaning. Subsequently, the surface of the dummy silicon wafer having a size of 2.0×2.0 mm was observed again with a scanning electron microscope (trade name: JSM-7900F, manufactured by JEOL Ltd.). A sample without any scratch observed at the surface was considered as a conforming product and was rated as "○"; and a sample having scratches such as an indentation mark observed at the surface was considered as a defective product and was rated as "x". The results are presented in Table 1 and Table 2.

(Evaluation of Moisture Absorption Reflow)

Each of the film-like adhesives according to Examples and Comparative Examples was laminated to a dummy silicon wafer (8-inch size, thickness 100 μm) using a manual laminator (trade name: FM-114, manufactured by TECHNOVISION, INC.) at a temperature of 70° C. and a pressure of 0.3 MPa. Next, a dicing tape (trade name: K-13, manufactured by Furukawa Electric Co., Ltd.) and a dicing frame (trade name: DTF2-8-1H001, manufactured by DISCO Corporation) were laminated on the surface on the opposite side of the dummy silicon wafer in the film-like adhesive using the same manual laminator at room temperature and a pressure of 0.3 MPa. Thus, a specimen was obtained. This specimen was diced into a size of 5.0×5.0 mm using a dicing apparatus (trade name: DFD-6340, manufactured by DISCO Corporation) equipped with a biaxial dicing blade (Z1: NBC-ZH2030-SE (DD), manufactured by DISCO Corporation/Z2: NBC-ZH127F-SE (BE), manufactured by DISCO Corporation). Thus, a film-like adhesive-attached semiconductor chip was produced.

Next, the film-like adhesive-attached semiconductor chip was thermocompression bonded to a lead frame substrate (42 Alloy system, manufactured by TOPPAN PRINTING CO., LTD.) using a die bonder (trade name: DB-800, manufactured by Hitachi High-Technologies Corporation) under the conditions of normal temperature, a pressure of 0.1 MPa (load 400 gf), and a time of 1.0 second. The resultant was encapsulated with a molding agent (trade name: KE-3000F5-2, manufactured by KYOCERA Corporation) using a molding apparatus (trade name: V1R, manufactured by TOWA CORPORATION), and the film-like adhesive-attached semiconductor chip was thermally cured by performing a heat treatment at 175° C./5 hours. A semiconductor package was assembled, and the encapsulated semiconductor package was treated to absorb water in a constant temperature constant humidity chamber (trade name: PR-1J, manufactured by ESPEC CORP.) under the conditions of 85° C./85% for 168 hours. Subsequently, the semiconductor package was heated for 10 seconds at 260° C. in an IR reflow furnace. The semiconductor package obtained after heating was cut with a diamond cutter, and an observation was made to see whether detachment had occurred between the film-like adhesive and the semiconductor chip or the lead frame substrate, using an ultrasonic probing apparatus (SAT) (trade name: FS300III, manufactured by Hitachi Power Solutions Co., Ltd.). A sample in which detachment occurred in none of twenty-four semiconductor packages thus assembled, was considered as a conforming product and was rated as "○"; and a sample in which detachment occurred in at least one among twenty-four semiconductor packages thus assembled, was considered as a defective product and was rated as "x". The results are presented in Table 1 and Table 2.

TABLE 1

| Filler | Average particle size (μm) | Compression ratio at break (%) | Fracture strength (GPa) | Example 1 | Example 2 | Example 3 | Example 4 | Example 5 | Example 6 |
|---|---|---|---|---|---|---|---|---|---|
| SC0280-SF | 2.0 | 40 | 0.24 | 240 | 362 | 550 | | | |
| SC0475-SF | 4.0 | 35 | 0.26 | | | | 230 | 800 | |
| AU203A | 3.0 | 50 | 0.35 | | | | | | 330 |
| FB-3SDX | 3.0 | 3 | 2.4 | | | | | | |
| MSP-SN05 | 0.5 | 38 | 0.28 | | | | | | |
| AG-4-8F | 2.0 | 20 | 2.1 | | | | | | |
| HF-01 | 1.0 | 10 | 3.0 | | | | | | |
| Filler volume (vol %) | | | | 40 | 50 | 60 | 40 | 70 | 40 |
| Lowest melt viscosity (Pa · s) | | | | 800 | 3000 | 9500 | 500 | 10000 | 600 |
| Lowest melt viscosity reaching temperature (° C.) | | | | 130 | 125 | 128 | 120 | 119 | 123 |
| Thermal conductivity after curing of film-like adhesive (W/m · K) | | | | 6.0 | 9.0 | 14.0 | 13.0 | 20.0 | 11.0 |
| Filler damage evaluation | | | | ○ | ○ | ○ | ○ | ○ | ○ |
| Moisture absorption reflow evaluation | | | | ○ | ○ | ○ | ○ | ○ | ○ |

TABLE 2

| Filler | Average particle size (μm) | Compression ratio at break (%) | Fracture strength (GPa) | Comparative Example 1 | Comparative Example 2 | Comparative Example 3 | Comparative Example 4 | Comparative Example 5 | Comparative Example 6 |
|---|---|---|---|---|---|---|---|---|---|
| SC0280-SF | 2.0 | 40 | 0.24 | | | | | | |
| SC0475-SF | 4.0 | 35 | 0.26 | 1060 | 30 | | | | |
| AU203A | 3.0 | 50 | 0.35 | | | | | | |
| FB-3SDX | 3.0 | 3 | 2.4 | | | 185 | | | |
| MSP-SN05 | 0.5 | 38 | 0.28 | | | | 100 | | |
| AG-4-8F | 2.0 | 20 | 2.1 | | | | | 600 | |
| HF-01 | 1.0 | 10 | 3.0 | | | | | | 280 |
| Filler volume (vol %) | | | | 75 | 8 | 50 | 50 | 40 | 50 |
| Lowest melt viscosity (Pa · s) | | | | 35000 | 10 | 1000 | 10 | 2000 | 6000 |
| Lowest melt viscosity reaching temperature (° C.) | | | | 119 | 129 | 125 | 131 | 131 | 130 |
| Thermal conductivity after curing of film-like adhesive (W/m · K) | | | | 22.0 | 0.5 | 0.6 | 0.2 | 11.0 | 2.2 |
| Filler damage evaluation | | | | ○ | ○ | x | ○ | x | x |
| Moisture absorption reflow evaluation | | | | x | ○ | ○ | ○ | ○ | ○ |

As shown in Table 1, in Examples 1 to 6, the compression ratio at break in a microcompression test of the heat-conductive filler (D) was 5 to 50% of the average particle size of the sample; the fracture strength in a microcompression test was 0.01 to 2.0 GPa; the thermal conductivity was 30 W/m·K or higher; the content of the heat-conductive filler material (D) was 10 to 70 vol % with respect to the total amount of the epoxy resin (A), the epoxy resin curing agent (B), the phenoxy resin (C), and the heat-conductive filler material (D); and when the temperature was raised from room temperature at a rate of temperature increase of 5° C./min, the lowest melt viscosity in the range of 200 to 10,000 Pa·s was reached at a temperature of 80° C. or higher. Therefore, the thermal conductivity after curing of the film-like adhesive was 1 W/m·K or higher, and excellent heat dissipation properties were obtained. Satisfactory results were obtained also for the filler damage evaluation and the moisture absorption reflow evaluation.

On the other hand, as shown in Table 2, in Comparative Example 1, the content of the heat-conductive filler material (D) was 75% with respect to the total amount of the epoxy resin (A), the epoxy resin curing agent (B), the phenoxy resin (C), and the heat-conductive filler material (D), and this content was more than 70 vol %, which is the upper limit specified in claim 1. Thus, the film-like adhesive became brittle, and poor results were obtained for the moisture absorption reflow evaluation. Furthermore, in Comparative Example 2, the content of the heat-conductive filler material (D) was 8 vol % with respect to the total amount of the epoxy resin (A), the epoxy resin curing agent (B), the phenoxy resin (C), and the heat-conductive filler material (D), and this content was less than 10 vol %, which is the lower limit specified in claim 1. Therefore, the thermal conductivity after curing of the film-like adhesive was 0.5 W/m·K, and poor results for heat dissipation properties were obtained. In Comparative Example 3, since the thermal conductivity of the heat-conductive filler (D) was 1 W/m·K and was lower than 30 W/m·K, which is the lower limit specified in claim 1, the thermal conductivity after curing of the film-like adhesive was 0.6 W/m·K, and poor results for heat dissipation properties were obtained. Furthermore, in Comparative Example 3, since the fracture strength in a microcompression test of the heat-conductive filler material (D) was 2.4 GPa and was higher than 2.0 GPa, which is the upper limit specified in claim 1, poor results were obtained also for the filler damage evaluation. In Comparative Example 4, the thermal conductivity of the heat-conductive filler (D) was 0.2 W/m·K and was lower than 30 W/m·K, which is the lower limit specified in claim 1. Therefore, the thermal conductivity after curing of the film-like adhesive was 0.2 W/m·K, and poor results for heat dissipation properties were obtained. In Comparative Example 5 and Comparative Example 6, since the fracture strengths in a microcompression test of the heat-conductive filler material (D) were 2.1 GPa and 3.0 GPa, respectively, and were greater than 2.0 GPa, which is the upper limit specified in claim 1, poor results were obtained for the filler damage evaluation.

EXPLANATIONS OF LETTERS OR NUMERALS

1 WAFER
2 ADHESIVE LAYER
3 DICING TAPE
4 SEMICONDUCTOR CHIP
5 ADHESIVE LAYER-ATTACHED SEMICONDUCTOR CHIP
6 WIRING BOARD
7 BONDING WIRE
8 ENCAPSULATING RESIN
9 SEMICONDUCTOR PACKAGE
14 HEAT SINK
15 FILM-LIKE ADHESIVE

The invention claimed is:

1. An adhesive comprising an epoxy resin, an epoxy resin curing agent, a phenoxy resin, and a heat-conductive filler material,
   wherein the heat-conductive filler material has an average particle size of 0.1 to 10.0 μm, a compression ratio at break in a microcompression test of 5 to 50% of the average particle size of a sample, a fracture strength in a microcompression test of 0.01 to 2.0 GPa, and a thermal conductivity of 30 W/mK or higher,
   a content of the heat-conductive filler material is 10 to 70 vol % with respect to the total amount of the epoxy resin, the epoxy resin curing agent, the phenoxy resin, and the heat-conductive filler material, and
   the adhesive has a thermal conductivity after thermal curing of 1.0 W/mK or higher, wherein
   the heat-conductive filler material has a core material coated on the surface with silver, the amount of silver coating is 10 to 95% by weight with respect to the total amount of the heat-conductive filler material, and
   the core material is a silicone resin, wherein
   when the temperature is raised from room temperature at a rate of temperature increase of 5° C./min, the adhesive acquires a lowest melt viscosity in the range of 200 to 10,000 Pa s at a temperature of 80° C. or higher.

2. The adhesive according to claim 1, having a thickness of 1 to 100 μm.

* * * * *